United States Patent [19]

Schulte

[11] 4,447,291
[45] May 8, 1984

[54] METHOD FOR VIA FORMATION IN HGCDTE

[75] Inventor: Eric Schulte, Richardson, Tex.

[73] Assignee: Texas Instruments Incorporated, Dallas, Tex.

[21] Appl. No.: 528,206

[22] Filed: Aug. 31, 1983

[51] Int. Cl.³ .................... H01L 21/306; B44C 1/22; C03C 15/00; C03C 25/06
[52] U.S. Cl. ................................ 156/643; 156/644; 156/651; 156/655; 156/659.1; 204/192 E; 252/79.1
[58] Field of Search ............... 204/192 E; 427/74, 76; 357/17, 30; 430/313; 156/640, 643, 644, 645, 651, 652, 654, 655, 659.1, 662; 252/79.1; 136/260, 264; 29/572

[56] References Cited

U.S. PATENT DOCUMENTS

| | | | |
|---|---|---|---|
| 3,234,058 | 2/1966 | Marinace | 156/644 X |
| 4,290,844 | 9/1981 | Rotolante et al. | 156/655 X |
| 4,310,583 | 1/1982 | Baker et al. | 156/655 X |

Primary Examiner—William A. Powell
Attorney, Agent, or Firm—Robert Groover; Melvin Sharp; James T. Comfort

[57] ABSTRACT

A via formation process for HgCdTe (i.e., for pseudo-binary alloys of HgTe and CdTe). Photoresist is patterned on the HgCdTe surface, and ion milling is used to cut holes in the HgCdTe as defined by the photoresist. With this photoresist still in place, the HgCdTe is wet etched to smooth the via walls and expand the via size to a precise dimension.

6 Claims, 1 Drawing Figure

METHOD FOR VIA FORMATION IN HGCDTE

BACKGROUND AND SUMMARY OF THE INVENTION

The present invention relates to fabrication of infrared imagers.

It is highly desirable to have infrared imagers which will operate at wavelengths down to the limits of the available long-wavelength atmospheric window, i.e. at wavelengths of 8–12 microns.

The detection of such long wavelengths, if it is to be done at moderate cryogenic temperatures (e.g. at liquid nitrogen rather than liquid helium temperatures), is preferably done using a very narrow bandgap semiconductor, such as $Hg_{I-x}Cd_xTe$. Such alloys are referred to generically as "HgCdTe". This pseudo-binary alloy, if it has a composition such as $x=0.2$, will have a bandgap small enough (0.1 eV) to be bridged by 12 micron photons.

Conventional approaches using HgCdTe area arrays have typically used HgCdTe photodiodes as optical detectors, and have interconnected these photodiodes with silicon processing stages.

However, if any sizable array of infrared detectors is used, it can be a very difficult problem to get the raw output of the infrared detectors over to the silicon processor stages. That is, there are many applications for which a two-dimentional focal plane array larger then 100×100 would be desirable. In such applications, it is very difficult to connect so many infrared detector locations to silicon processing stages without greatly degrading the duty cycle of the detector stages. In particular, where photo-diode detector cells are used, the silicon processing circuitry required is rather complex, and a merely reasonable pitch in the infrared imaging plane (e.g. 0.002" pixel spacing center-to-center) would impose stringent requirements on silicon geometry, if the same pitch must be followed in the silicon processing stages.

One method which has been used in the prior art to connect infrared detector sites to silicon processors is a hybrid approach, in which the infrared detector cells are bump bonded, in many separate operations, onto a silicon carrier. This is an expensive low-yield operation.

Thus it is an object of the present invention to provide an infrared imager process which permits direct connection from an infrared detection site to silicon processing stages.

Prior art method for interconnection of HgCdTe to silicon substrates has been bump bonding. In this method, a tall host of a metal such as indium which is very soft at room temperatures is formed at each pixel site in the HgCdTe, and the HgCdTe is flipped over and pressed onto the silicon so that the indium bump bonding posts provide deformable contacts to a pattern of bonding sites on the silicon.

However, this approach has several difficulties. First, it requires that the detector technology used to be such that the HgCdTe detector cells can be accessed from the backside of the chip. Second, it requires a mechanical pressure-bonding step which may induce damage. Third, the unusaul processing step required to form the indium posts will itself make some contribution to yield degradation. Fourth, the alignment step which aligns the indium posts on the under side of the HgCdTe slice with the contact locations on the silicon surface can be rather difficult.

An alternative method of vertically integrating HgCdTe with silicon would be to cut vias through the HgCdTe, so that contact could h=made from the front surface of the HgCdTe to silicon contacts. However, while processes which will cut vias through HgCdTe are known, there are significant difficulties with the prior art processes. First, it is very important that the HgCdTe via be formed without inducing physical damage or surface states beyond an absolute minimum. Since the bandgap of HgCdTe is so small, it does not take much physical damage to induce disastrous leakage current levels or disastrously lowered breakdown voltages. One aspect of this requirement is the walls of the HgCdTe via should be extremely smooth. However, this has been difficult to achieve with prior art methods. Second, in order to achieve good quality deposition of insulator and metal layers through the via hole, it is desirable to be able to control the taper of the via hole, i.e., the slope of the sidewalls. This is also difficult with the prior art methods. Moreover, it may be necessary to precisely control via size in HgCdTe. Thus, for example, if the via protrudes into an active region of the infrared detection device, i.e., into a region where photo carriers are being generated and collected, the via walls may provide a leakage path which partially shorts out the detection device. Alternatively, if the via is undersized, the contact made to silicon may not be of adequate quality.

Thus, it is an object of the present invention to provide a method for cutting via holes through HgCdTe.

It is a further object of the present invention to provide a method for cutting via holes through HgCdTe which have controlled sidewall slope.

It is a further object of the present invention to provide a method for cutting via holes through HgCdTe which have very smooth sidewalls.

It is a further object of the present invention to provide a method for cutting via holes through HgCdTe wherein the via sidewalls have a minimal density of recombination sites.

It is a further object of the present invention to provide a method for cutting via holes through HgCdTe wherein the sidewall slope and the size of the via are both precisely controlled.

To achieve these and other objects of the invention, the present invention provides:

A method for etching vias in HgCdTe, comprising the steps of:

ion milling a hole through said HgCdTe, said hole being substantially smaller than the desired diameter of said via; and Spray etching said HgCdTe, whereby said hole is enlarged to form a via having a desired size and smooth walls.

BRIEF DESCRIPTION OF THE DRAWING

The present invention will be described with reference to the accompanying drawing, wherein:

The FIGURE shows a cross-section of a portion of a single pixel of a HgCdTe device structure used in describing the present invention.

DESCRIPTION OF THE PREFERRED EMBODIMENTS

Figure 1:
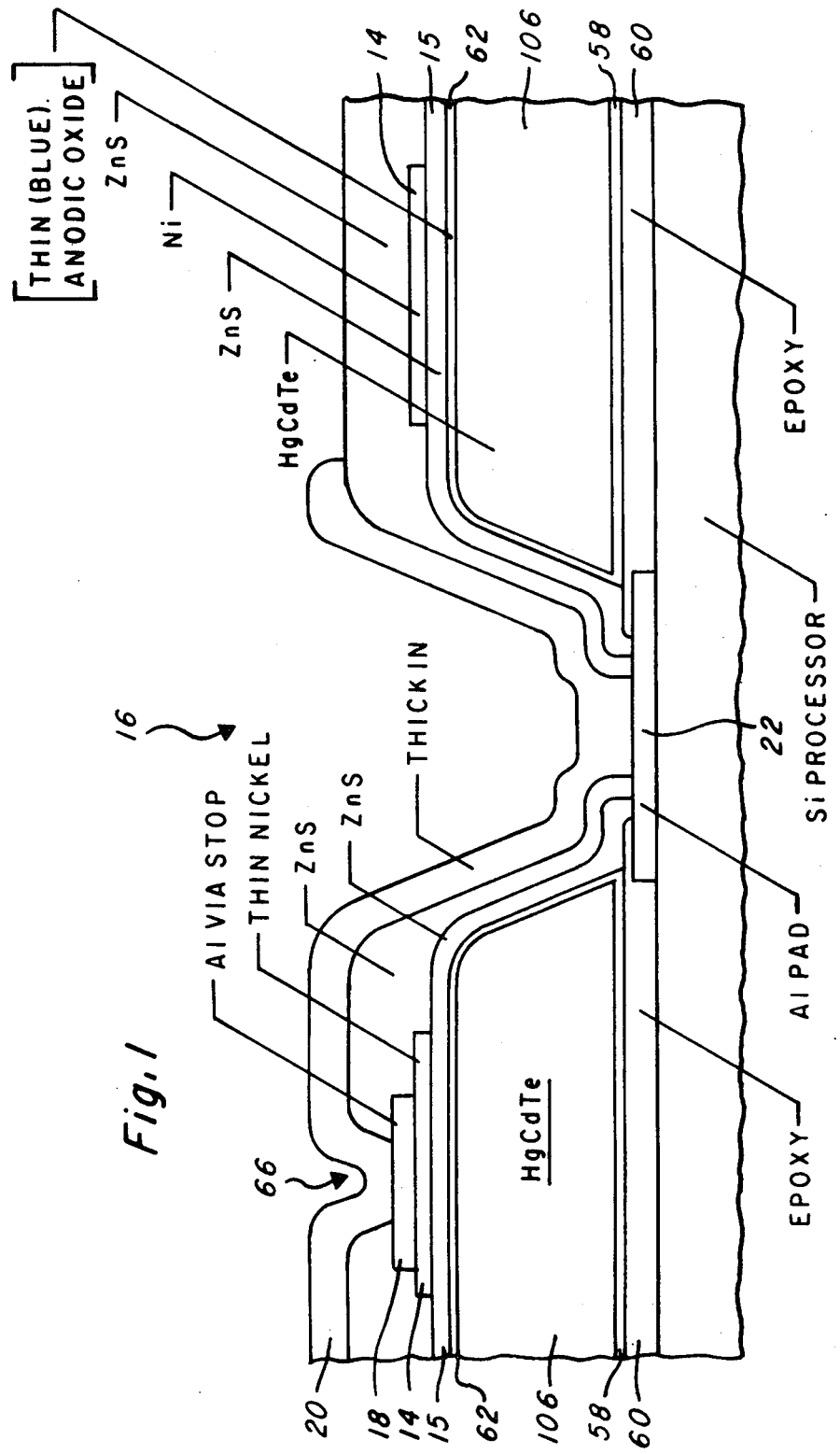

A view of a sample HgCdTe detector sites is shown in FIG. 1. The fabrication of this sample structure will be described in detail, but the present invention 13, of course, is applicable to fabrication of many other device structures.

The HgCdTe substrate 106 comprises long-wavelength material, e.g. $HG_{0.8}Cd_{0.2}Te$. A storage gate 14 of semi-transparent metal (e.g. nickel or chromium) is provided for each pixel. Note that the storage gates for adjacent pixels are separate, and there is no electrical contact whatsoever between adjacent pixels in the HgCdTe. The storage gate 14 is preferably thin, e.g. 100 angstroms, to promote transparency. This storage gate overlies an insulator 15, such as zinc sulphide. A main via 16 connects the HgCdTe sensor portion to the corresponding silicon averaging capacitor site. In order to make contact to the extremely thin storage gate, a via stop 18 is placed on the storage gate, and a metal film interconnect (e.g. 1 micron of indium) is used to connect the via stop 18 to the contact 22 on the silicon at the bottom of the via.

The formation of this device structure will now be described. Massive amounts of processing detail are included, to provide a fully enabling description of the invention, but these processing details do *not* define limitations of the invention.

First, a monocrystalline HgCdTe slice is lapped to be parallel. At least one side is polished smooth, using one half percent bromine in methanol. The polished side is anodically oxidized to about 700 angstroms of oxide 58 in potassium hydroxide, using, e.g. 300 microamps current for HgCdTe slice measuring about 0.2×0.9 inches.

Preferably the HgCdTe used is n-type, with a carrier concentration of 5E14 per cubic cm. Of course, lower carrier concentrations could be used.

Next, the HgCdTe is mounted on the silicon processors. Silicon is preferably flat. For convenience, the HgCdTe mounting is preferably done before the silicon wafer has been completely diced up into chips, so that a HgCdTe bar can be mounted to, e.g., 4 scribed silicon chips simultaneously, before the chips are actually separated. The silicon substrates (chips or groups of chips) are preferably flat, and must be cleaned thoroughly on both sides. Each silicon substrate is heated to a controlled temperature of 75° C., and a very low-viscosity and low-surface tension glue 60 is then applied to the center detector pattern (i.e. to the averaging capacitor area on each of the silicon chips) on each silicon bar. The HgCdTe bar is then placed on the silicon substrate, oxide down. The alignment marks in the silicon are used to obtain rough alignment of the HgCdTe bar at this time. A press is used to hold the HgCdTe in place while the glue sets, using, e.g. three to four ounces of pressure over the 32×32 array. The gluing step is required to produce a thin and uniform glue bond, and a low viscosity epoxy glue such as Epotek 301 is preferably used. After the gluing operation, the excess HgCdTe which hangs over the edges of the silicon bar is then scribed and broken off.

The silicon substrate, having the HgCdTe bar glued to it, is now waxed to a glass lapping plug. These plugs are commercially available parts, formed, e.g., as cylinders one inch in diameter and $1\frac{3}{4}$ inches tall, having flat and parallel ends.) The flatness of the substrate on the lapping plug is preferably within two microns. If it is not flat within two microns, the waxing step is preferably performed over. The thinning steps can then begin. Preferably the alignment marks on the silicon are protected, e.g. by painting them with resist and curing, prior to the lapping operation. The remainder of the silicon processor bar should be adequately protected by its thick (preferably one micron) nitride protective overcoat. It may also be desirable to protect the contact pads on the silicon bar during the polishing step. Alternatively, exposed resist is applied over the whole structure prior to polishing. The resist on the HgCdTe will be polished off. The HgCdTe is then lapped, e.g. with three micron grit on glass down to about 75 microns thick, followed by lapping with 0.3 micron grit on a polishing cloth (e.g., Buehler "Texmet" TM) until the scratches left from the three micron lap are gone. The HgCdTe is then polished, with half percent bromine-methanol on a pellon pad, down to 20 to 25 microns. A final polishing step, using one eighth percent bromine-methanol solution, takes the HgCdTe down to 12 microns above the silicon surface.

The silicon substrate is then wax-mounted to a silicon secondary substrate, which is used simply as a carrier for processing. Alternatively, sapphire or other rigid material can be used for this carrier.

At this point, the structure in hand is a long thinned strip of HgCdTe, glued across several connected Si chips. The first patterning step is now performed, to reduce the area 106 required for the imaging array 56 on each chip. (In addition, a small strip of HgCdTe is also preferably left in place connecting each of the arrays together. This provides electrical connection between the HgCdTe areas, and is useful to pass current during anodic oxidation. It will be removed later during processing.

Preferably this step is done, e.g. by spinning on a resist such as 180CP (available from Hunt) at 4,000 RPM for 20 seconds. The resist is dried for three minutes at 60 C, exposed, developed for thirty seconds, rinsed for 15 seconds, and ashed at 200 watts for 30 seconds. At this point, it is again desirable to apply special protection to any exposed aluminum, such as the alignment marks, since aluminum is attacked by bromine-methanol. A spray etch with fresh $\frac{1}{8}\%$ bromine-methanol is then applied until the pattern clears, i.e. until the separation trenches have etched down to the epoxy. The remaining thin epoxy is then ashed off on a plasma asher, and the photoresist is then removed.

The second patterning step patterns the via 16 through the HgCdTe. This is a crucial step, since the via 16 geometry must satisfy several constraints. If the via 16 is etched too small, the device can short out at the bottom of the via. If the via is etched too large, so that it intrudes into the active area of the device, the dark current will be greatly increased. Third, the walls of the via 16 must be very smooth to provide good step coverage. For example, simple ion milling leaves rough walls. Thus, the presently preferred embodiment uses ion milling to make a small via hole (e.g. 0.4 mils), then uses spray etching to enlarge the via to get to the right diameter. After the resist is patterned, the ion milling is preferably done with argon ions, using e.g., 600 milliamps beam current at 600 volts at about $\frac{1}{4}$ TORR of pressure. The stage is preferably angled ten degrees to the beam and is rotated. This stage must be cooled. In the presently preferred embodiment the stage is cooled to about 5° C. during milling. Preferably the ion milling is performed intermittently, to assure that the device does not heat up locally. Heating is most undesirable because the dissociation of HgCdTe occurs at relatively low temperatures. Such dissociation can alter the bandgap, degrade interface stability, increase the carrier concentration, or have other undesirable effects. After ion milling has cut all the way through the HgCdTe, the device, with its photoresist still intact, is spray etched in fresh $\frac{1}{8}$% bromine-methanol in ten second stages until the via has been undercut to a total diameter of (in the presently preferred embodiment) 0.8 mils. After the photoresist is removed, the whole device is then static etched in one-eighth percent bromine methanol for thirty seconds, to remove any damaged layer which may have been generated during the ion milling step, and to smooth the top lip of the via for better subsequent step coverage.

It should be noted that, although spray etching is preferable, it is not strictly necessary, and other wet-etching steps may be used instead. It should also be noted that other organic solvents than methanol may be used as bromine carriers, and that other bromine concentrations may be used.

The next step is growth of an anodic oxide layer 62 on the HgCdTe. After a preliminary ashing step for cleanup, oxide is grown to first blue (around 700 angstroms thickness) in potassium hydroxide, using a current of, e.g., 23 microamps for a 1-device substrate. This provides a mixture of cadmium oxides, Te oxides, and tellurites. This layer plus the zinc sulfide layer 15 form the insulator of the MIS capacitor. Resist is now patterned to define the areas where the first zinc sulfide layer 15 is to be deposited. Preferably 2500 angstroms of zinc sulfide is deposited by evaporation off axis (e.g. 30 degrees off axis) onto a rotating table. The zinc sulfide is lift patterned, e.g. by immersion and spray in tetrachloroethylene.

ZnS over anodic oxide is the preferred insulator, but many others (preferably of high permittivity) can be used, e.g. $Nb_2O_5$, $Ta_2O_5$, $TiO_2$, $TiO_2/Al_2O_3$ composites, etc.

The transparent MIS gate 14 can now be deposited. A thin resist layer (e.g. 4000 or 5000 angstroms) is formed over areas outside of the storage gate 14. A short ion milling step is applied for adhesion before the gate is actually deposited. One hundred twenty five angstroms of nickel is then deposited, and lifted off from undesired areas.

The via stop 18 is then formed, again by lift off. Preferably 800 angstroms of aluminum are used. Again, an adhesion milling step is preferably used before the metal is deposited.

A second zinc sulfide layer 64 is then deposited in the same locations as the first zinc sulfide layer. Preferably 9000 angstroms are deposited in the second layer. Preferably in adhesion milling step is used before the zinc sulfide is deposited. Again, the zinc sulfide is patterned by liftoff.

Next, the MIS via 66 is cut. This will cut the opening for connection of the metal interconnect 20 to the via stop 18 on the storage gate 14. This is preferably done using a $\frac{1}{8}$% bromine-methanol wet etch.

Next, the substrate via is preferably cut. The substrate via is not shown in FIG. 1, but provides the bias connection for the HgCdTe bar. This etch is preferably done using $\frac{1}{8}$% bromine methanol.

The main via 16 is then opened again. In this case, a $\frac{1}{8}$% bromine-methanol etch is preferably used. This etch is used to open up contact through the zinc sulfide to the aluminum bond pads 22 in the underlying silicon, as shown in FIG. 1. Note that, at the bottom of via 16, a substantial width of the first insulator layer 15, 14 and the second insulator layer 64 separates the HgCdTe substrate 106 from the interconnect 20 and band pad 22.

Finally, the metal interconnects 20 are patterned. Preferably these two are patterned by liftoff. Preferably a double adhesion mill is performed and 100 angstroms of nickel is deposited first, and then about 1$\frac{1}{2}$ microns of indium are deposited (using angle sputtering). At this stage also are formed the ground connection for the HgCdTe bar 106, through the substrate via.

What is claimed is:

1. A method for forming vias in HgCdTe, comprising the steps of:
   ion milling a hole through said HgCdTe, said hole being substantially smaller than the desired diameter of said via; and
   wet etching said HgCdTe, whereby said hole is enlarged to form a via having a desired size and smooth walls.

2. The method of claim 1, wherein said wet etching step comprises spraying said HgCdTe with a solution of bromine and methanol.

3. The method of claim 1, wherein said wet etching step applies a solution which comprises approximately $\frac{1}{8}$% bromine in an organic solvent.

4. The method of claim 1, further comprising the preliminary step of applying a patterned masking material to expose only a predetermined portion of said HgCdTe to said ion milling step.

5. The method of claim 4, wherein said masking material is left in place during said wet etching step.

6. The method of claim 2 wherein said solvent consists essentially of methanol.

* * * * *